US012652035B2

(12) United States Patent
Lu et al.

(10) Patent No.: US 12,652,035 B2
(45) Date of Patent: Jun. 9, 2026

(54) FAULT CURRENT BYPASS BASED SOLID STATE BREAKERS AND ACTIVE CLAMPING SNUBBERS FOR DC CIRCUIT BREAKERS

(71) Applicant: Drexel University, Philadelphia, PA (US)

(72) Inventors: Fei Lu, Wynnewood, PA (US); Hua Zhang, Philadelphia, PA (US); Reza Kheirollahi, Philadelphia, PA (US)

(73) Assignee: Lehigh University, Bethlehem, PA (US)

( * ) Notice: Subject to any disclaimer, the term of this patent is extended or adjusted under 35 U.S.C. 154(b) by 239 days.

(21) Appl. No.: 18/574,128

(22) PCT Filed: Jun. 24, 2022

(86) PCT No.: PCT/US2022/034815
§ 371 (c)(1),
(2) Date: Dec. 26, 2023

(87) PCT Pub. No.: WO2022/272007
PCT Pub. Date: Dec. 29, 2022

(65) Prior Publication Data
US 2024/0333277 A1 Oct. 3, 2024

Related U.S. Application Data

(60) Provisional application No. 63/214,873, filed on Jun. 25, 2021.

(51) Int. Cl.
*H03K 17/0812* (2006.01)
*H02H 3/087* (2006.01)
(52) U.S. Cl.
CPC ....... *H03K 17/08122* (2013.01); *H02H 3/087* (2013.01)

(58) Field of Classification Search
CPC .......................... H03K 17/08122; H02H 3/087
See application file for complete search history.

(56) References Cited

U.S. PATENT DOCUMENTS

| | | | |
|---|---|---|---|
| 2007/0121257 A1 | 5/2007 | Maitra et al. | |
| 2015/0055260 A1* | 2/2015 | Tekletsadik | ............ H02H 9/005 |
| | | | 361/87 |

(Continued)

FOREIGN PATENT DOCUMENTS

| | | | | |
|---|---|---|---|---|
| KR | 20220005796 A | * | 1/2022 | ......... H03K 17/6871 |
| WO | WO-2015103857 A1 | * | 7/2015 | ............. H01H 9/542 |
| WO | WO-2018157915 A1 | * | 9/2018 | ............. H01H 9/542 |

OTHER PUBLICATIONS

International Preliminary Report on Patentability issued on Dec. 14, 2023 and Written Opinion completed on Dec. 22, 2022 issued in the International Patent Application No. PCT/US2022/034815, 7 pages . . . .

(Continued)

*Primary Examiner* — Daniel Cavallari
(74) *Attorney, Agent, or Firm* — Schott, P.C.

(57) ABSTRACT

Solid-state circuit breakers (SSCBs) have been witnessing an impressive progress with the aid of wide bandgap (WBG) devices such as silicon carbide (SiC) MOSFETs. Along with obtaining high efficiency as the result of low on-state resistance, response times have been gaining remarkable achievements in microseconds range. Not only that, the reported successes in control and gate drivers design and incorporating fault detection/location techniques in SSCBs are promising. A MOV-resistive capacitive switch (MOV-RCS) snubber for solid state circuit breakers addresses the following: 1) the MOV degradation issue in DCCBs is solved, 2) the maximum allowable DC bus voltage on DCCBs is extended. The solid state circuit breaker and an active clamping snubber includes a first circuit including a (Continued)

*The Proposed LVDC SSCB* fault current bypass based solid state breaker for low voltage direct current systems.

7 Claims, 10 Drawing Sheets

(56)                    References Cited

U.S. PATENT DOCUMENTS

| | | | |
|---|---|---|---|
| 2015/0108090 A1* | 4/2015 | Oates ..................... | H01H 33/12 |
| | | | 218/10 |
| 2015/0222111 A1* | 8/2015 | Magnusson ............ | H01H 9/541 |
| | | | 361/91.5 |
| 2019/0013662 A1 | 1/2019 | Norrga et al. | |
| 2020/0152407 A1 | 5/2020 | Askan | |
| 2021/0143630 A1 | 5/2021 | Du et al. | |

OTHER PUBLICATIONS

International Search Report issued in the International Patent Application No. PCT/US2022/034815, Mailed on Jan. 11, 2023, 2 pages . . . .

* cited by examiner

Mode I: Normal operating mode

Mode II: Fault occurs in the system

Mode III: Interruption begins, $S_1$ turns on

Mode IV: $S_m$ turns off, $C_s$ begins to charge

Mode V: Current commutates to MOV

Mode VI: Current reduces to leakage values

Mode VII: $S_1$ turns off, Interruption completes

The Proposed MOV-RCS snubber based SSCB

MOV-RCS

*Mode I: Normal operating mode*

*Mode II: Fault occurs in the system*

*Mode III: Interruption begins, $S_m$ turns off and $C_s$ begins to charge*

*Mode IV: Current commutates to MOV*

*Mode V: The current reduces to leakage values*

*Mode VI: $S_s$ turns off, Interruption completes*

Table I. DC system and SSCB parameters values

| Parameter | Design Value | Parameter | Design Value |
|---|---|---|---|
| $V_{DC}$ | 375V(600V) | $L_{Line}$ | 63μH |
| $L_{Load}$ ($R_{Load}$) | 14μH (1.5Ω) | $S_m$ and $S_1$ | C3M0016120D |
| $D_1$ | C4D20120D | $C_S$ | 500nF |
| MOV | V321DB40 | $R_s$ | 6.8kΩ |
| $C_{GS}$[1] on $S_m$ | 10nF | $C_{GS}$ on $S_s$ | 15.3nF |
| Gate resistance | 7.5Ω | Gate FB[2] | 30Ω |

(1) Gate-source capacitor,(2) Gate ferrite bead (impedance in 100MHz).

FIG. 17

Table II. DC System Specifications and SSCB Parameter Values

| Parameter | Design Value | Parameter | Design Value |
|---|---|---|---|
| $V_{DC}$ | 375V(550V) | $L_f$ | 63μH |
| $L_{Line}$ | 2μH | $R_{Load}$ | 1.5Ω |
| $S_m$ and $S_s$ | C3M0016120D | $C_S$ | 200nF |
| $R_s$ | 6.8kΩ | MOV | V321DB40 |

FAULT CURRENT BYPASS BASED SOLID STATE BREAKERS AND ACTIVE CLAMPING SNUBBERS FOR DC CIRCUIT BREAKERS

STATEMENT REGARDING GOVERNMENT SUPPORT

This invention was made with government support under Contract No. DE-AR0001114 awarded by the U.S. Department of Energy Advanced Research Projects Agency-Energy (ARPA-E). The government has certain rights in the invention.

BACKGROUND

Direct current (DC) systems have been witnessing remarkable developments worldwide, resulted in the state-of-the-art technologies in control, operation, and protection. Among them, DC circuit breakers (DCCBs) as the heart of implemented protective schemes have attracted the attention of researchers to introduce more reliable and efficient topologies. Hybrid CBs (HCBs) and solid-state CBs (SS-CBs) dominate DCCBs literature and publications.

HCBs benefit from the extremely low on-state resistance (10s of $\mu\Omega$) of the mechanical disconnectors (MDs) and fast commutation semiconductor devices. Although the operating speed of the MDs has achieved 10 microseconds, the response time of HCBs generally places in the milliseconds range. Implementing MDs reduces the power-density of the design and the operation of the moving contacts impacts the lifetime.

SSCBs with wide bandgap (WBG) devices present ultra-fast response times in the microseconds range. High efficiency can be achieved in SSCBs by connecting solid-state switches in parallel. Exemplary progresses in control and gate-driver designs, and incorporating soft-starting, fault detection, and fault location functions justify the effectiveness of SSCBs in newly established DC systems.

Energy absorbing elements are commonly used in SSCBs. First, DC currents have no zero-crossing point. Second, dissipating the residual energy of the line inductance is beyond the capacity of solid-state switches. So, energy absorbing components are vital to realize the stored inductive energy of the line inductance and clamp voltage oscillations.

Resistive-capacitive (RC), resistive-capacitive-diode (RCD), metal-oxide-varistors (MOVs), MOV-RC, MOV-RCD, and parallel MOVs snubbers have been applied in SSCBs. Pure capacitive (C) and transient voltage suppressions (TVSs) snubbers are also used in SSCBs but their applications are limited due to power ratings.

MOV-RCD snubber based SSCBs benefit from lower oscillations, lower clamping voltage, and smaller dv/dt. The capability of MOV-RCD snubber in interrupting kA ranges DC currents have been verified in the literature, and may be superior compared to the MOV-RC snubbers in achieving lower power shock on the switch during the turn-off.

On the other hand, MOV-RCD snubber based SSCBs suffer from low reliability due to the MOV degradation. MOVs are well known to degrade as the number of surge currents increase, and they experience long duration transients. When the MOV degrades, its energy absorbing capability decreases, the leakage current increases, and the duration to failure reduces. Problems occur when the MOV fails, which may cause a short circuit.

MOVs are sintered ceramic blocks whose most structure includes metal oxide (ZnO) grains with small portions of bismuth, cobalt, manganese, and other metal oxides. Being voltage dependent, MOVs are highly non-linear devices; the resistance of the MOV changes several orders of magnitude as it is exposed to high voltage overshoots. During conduction mode, it provides a highly conductive path for the fault currents, absorbs the stored inductive energy of the line inductance, converts it to heat, and dissipates it to ambience.

MOVs typically show negative temperature dependance. As the leakage current increases with the progress of the MOV degradation, the power consumption on the MOV increases. Increasing the power consumption raises the MOV temperature. As the MOV heats up, its leakage current rises. This process repeats until the power consumption on the MOV goes higher than the MOV power dissipation capability. In this case, the MOV temperature exceeds thermal stability temperature, and the thermal runaway happens, concluding in the MOV failure.

To prevent the MOV failure in CBs, usually a safe margin is considered in selecting the MOV's DC voltage rating. However, this method leads to dimensioning issue in CBs and usually results in overdesigned and ineffective transient protections. Also, increasing the voltage rating of the MOV leads to higher clamping voltage of the MOV. To address the MOV degradation and eliminate the leakage currents, current limiting fuses in series with MOVs and residual current mechanical disconnectors have also been proposed; however, the first one is not effective in preventing MOV degradation, and the latter slows down the operating speed of the SSCBs.

SUMMARY

Solid-state circuit breakers (SSCBs) have been witnessing an impressive progress with the aid of wide bandgap (WBG) devices such as silicon carbide (SiC) MOSFETs. Along with obtaining high efficiency as the result of low on-state resistance, response times have been gaining remarkable achievements in microseconds range. Not only that, the reported successes in control and gate drivers design and incorporating fault detection/location techniques in SSCBs are promising. A MOV-resistive capacitive switch (MOV-RCS) snubber for solid state circuit breakers may address the following: 1) the MOV degradation issue in DCCBs is solved, 2) the maximum allowable DC bus voltage on DCCBs is extended.

Figures 11A, 11B:
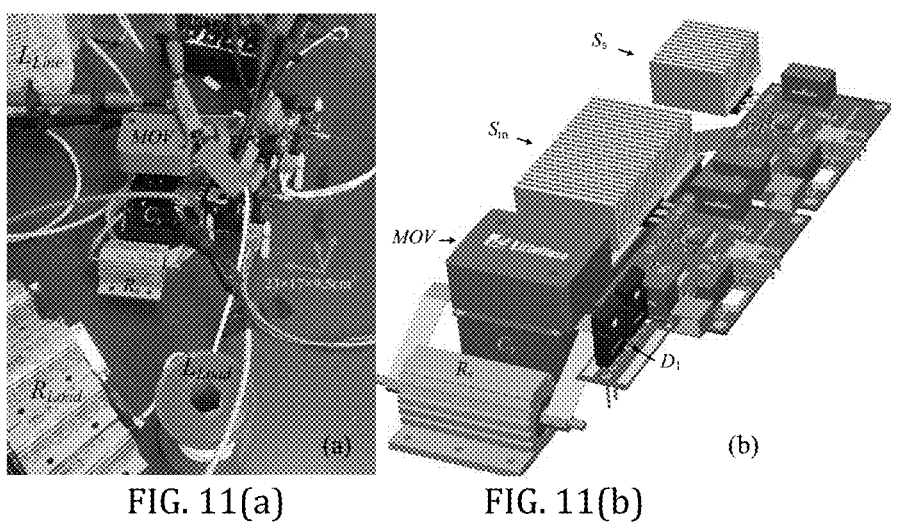
FIG. 11 displays the implemented SSCB and the 3D design view.
Figure 13:
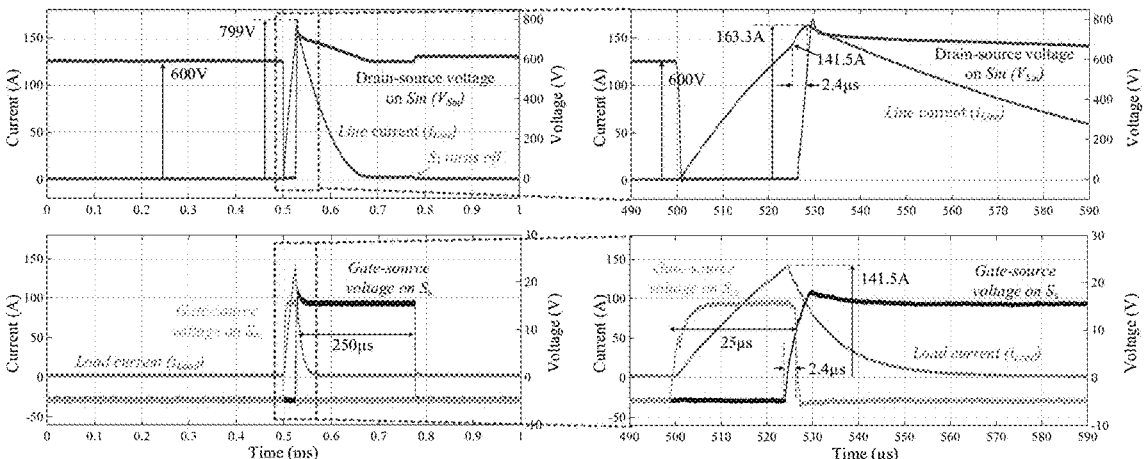

The resulted waveforms from the FIG. 11 device are shown in FIG. 13.

Figure 7:
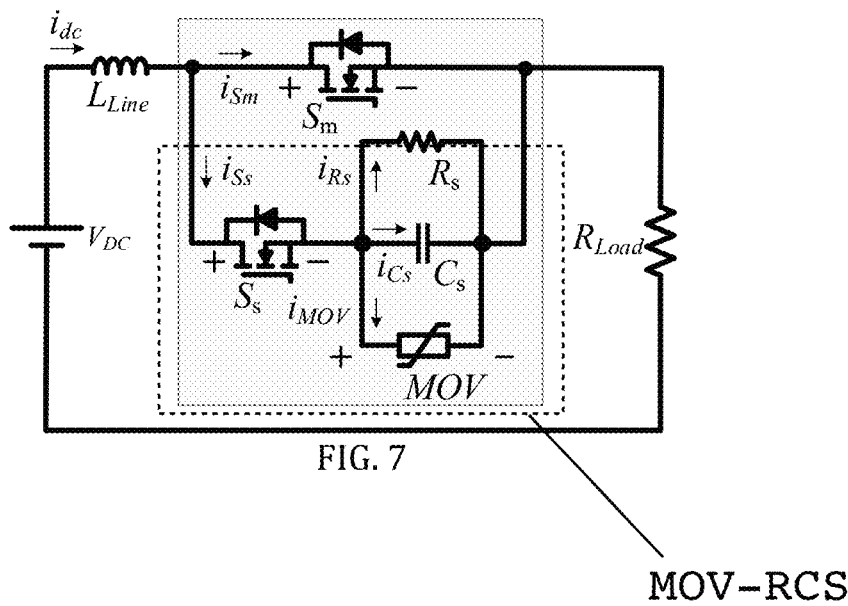
FIG. 7 shows the proposed MOV-RCS snubber based SSCB in a typical DC system.
Figure 14:
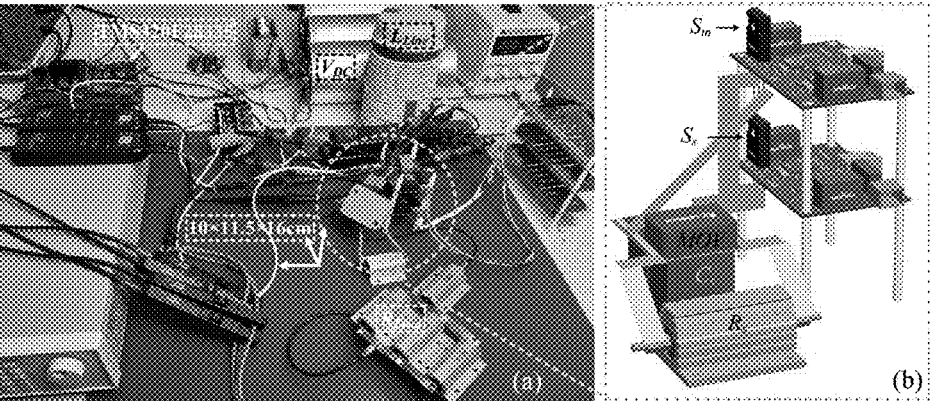

FIG. 14 (a) shows the implemented hardware set up with respect to FIG. 7.

FIG. 14 (b) indicates the 3D design view of the SSCB.

Figure 15:
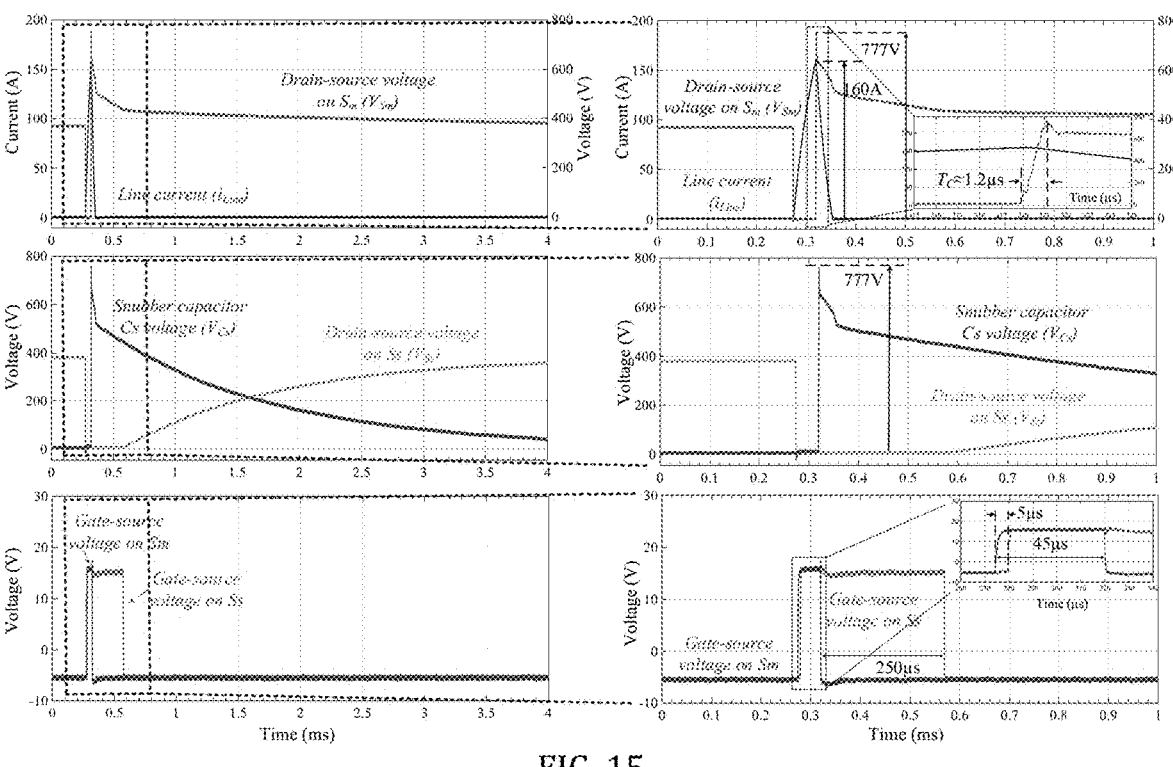

FIG. 15 indicates the experimental results discussed in Section 4.

Figure 16:
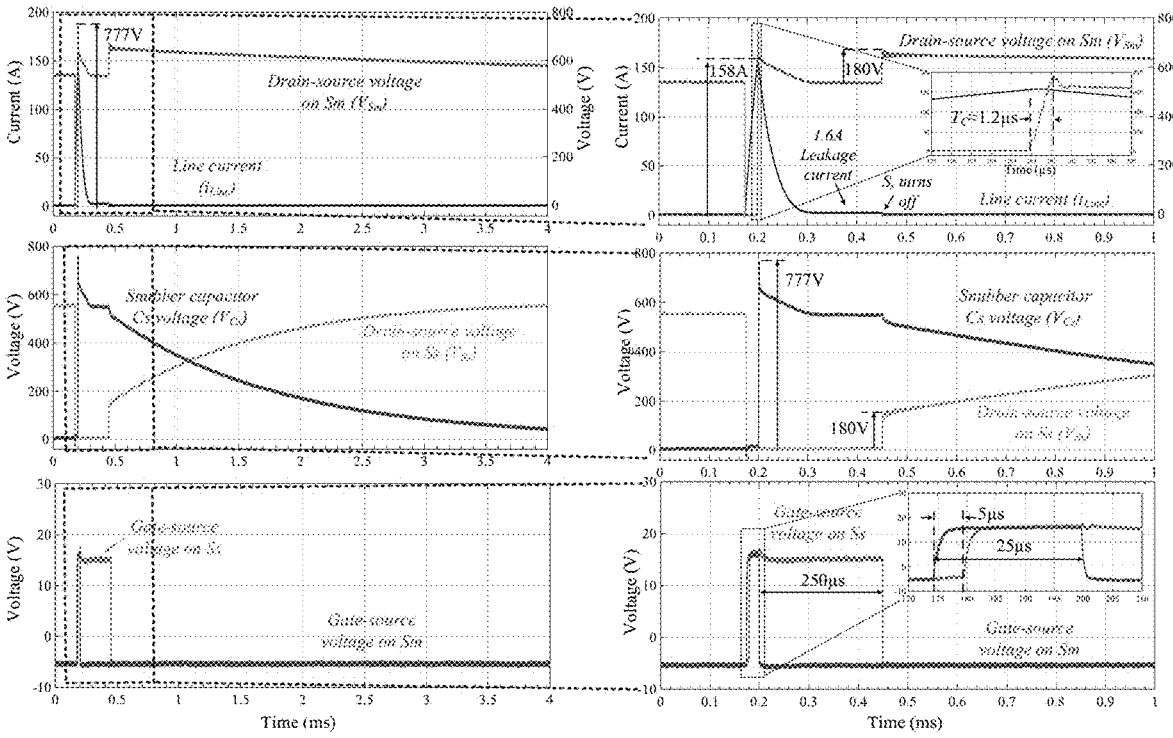

FIG. 16 shows the experimental results of Section 4.2

FIG. 17 shows Table I.

FIG. 18 shows Table II.

DETAILED DESCRIPTION OF THE EMBODIMENTS

1. MOV-RCS Snubber

Figure 1:
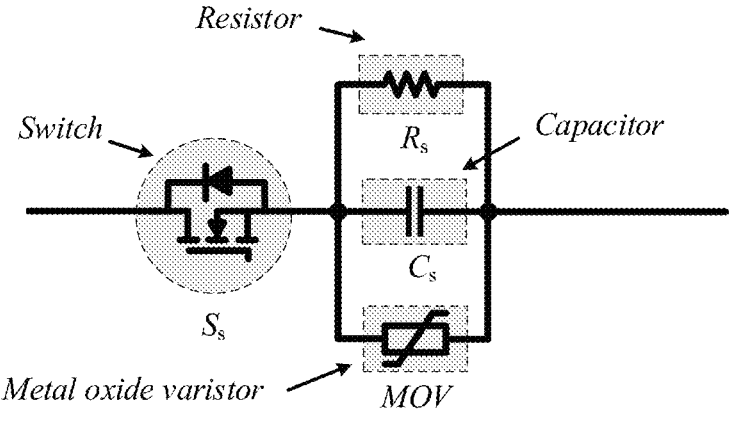
FIG. 1 shows a circuit topology of the MOV-RCS snubber.

FIG. 1 shows a circuit topology of the MOV-RCS snubber. It includes four components defined as follows:

MOV: This may be used to clamp the oscillation voltage across the DCCBs, and dissipate stored inductive energy of the line inductance during DC current interruption. The design methodology of choosing MOV in a typical DC system has been analyzed and the deciding parameters illustrated.

Capacitor (C): This is used to slow down the rising voltage across the DCCBs during DC current interruption. That is, the fault current commutates to the capacitor after turning the main switch off, and the voltage across the main switch in DCCBs may be built slowly to limit the dV/dt and reduce the voltage overshoot. It also may reduce the voltage oscillations on the gate of the main switch in DCCBs.

Resistor (R): This is used to discharge the voltage on the capacitor after DC current interruption and place the voltage on the snubber switch ($S_s$). That is, the resistor reduces the equivalent resistor across the MOV and capacitor. The functionality of the resistor is further explained in next sections.

Switch(S): The switch may be used to remove the voltage on the MOV after DC current interruption. In FIG. 1, a metal-oxide-semiconductor field-effect transistor (MOSFET) has been used; however, this switch can be insulated-gate bipolar transistor (IGBT), silicon-controlled rectifier (SCR), integrated gate-commutated thyristor (IGCT), or other SCR based semiconductor switches.

In the following two SSCBs are proposed based on the presented MOV-RCS snubber. It should be noted that also the following topologies are solid-state type, they are also applicable to mechanical circuit breakers (MCBs) and HCBs.

2. Fault Current Bypass Based SSCBs

2.1. Circuit Topology

Figure 2:
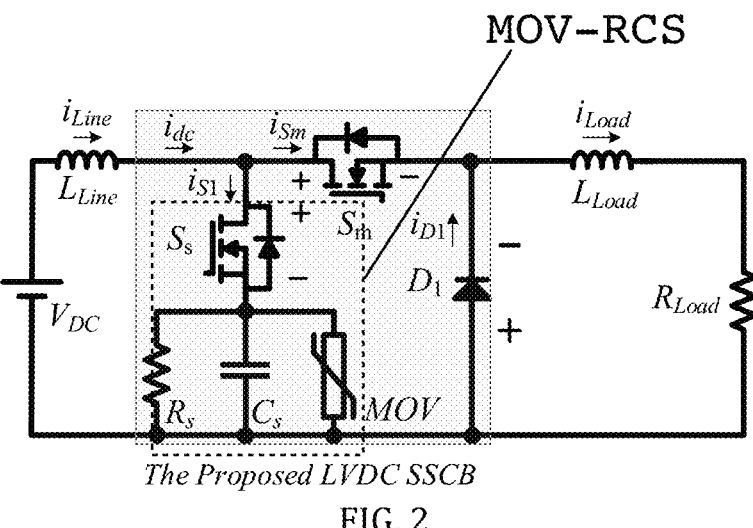
FIG. 2 shows the proposed SSCB in a typical DC system where the breaker connected between positive and negative lines.

FIG. 2 shows the proposed SSCB in a typical DC system where the breaker is connected between positive and negative lines. There are several things to note in this SSCB: 1) The MOV is removed from the main switch and leakage current may not be a further a design criteria; clamping voltage can be chosen near to the nominal voltage; 2) dV/dt across the main switch $S_m$ may be reduced using the snubber capacitor $C_s$; 3) the snubber switch $S_s$ turns off at almost zero current; no oscillations may appear on $S_s$ during current interruption; 4) the stored inductive energy of the line inductor $i_{Line}$ may be prevented to flow through the faulty section, which increases the safety; 5) the maximum allowable DC bus voltage may be extended by choosing the clamping voltage of the MOV near to the nominal voltage.

B.2. Working Principle

Figure 3:
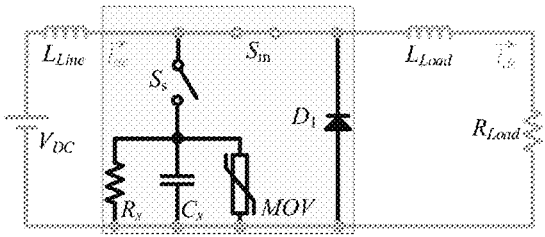
FIGS. 3 and 4 represent the operating modes and the electrical waveforms of the proposed SSCB in interrupting DC current, respectively.
Figure 3:
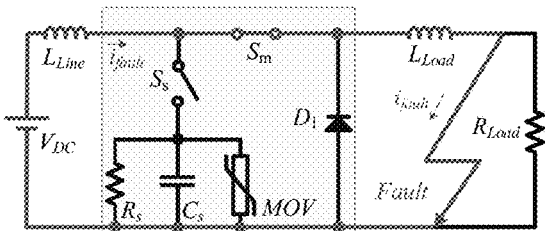
Figure 3:
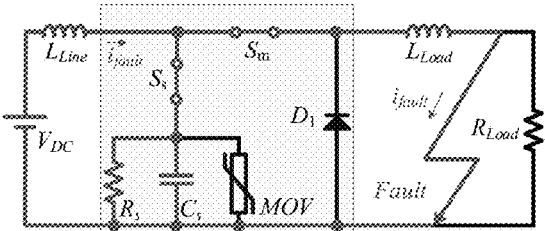
Figure 3:
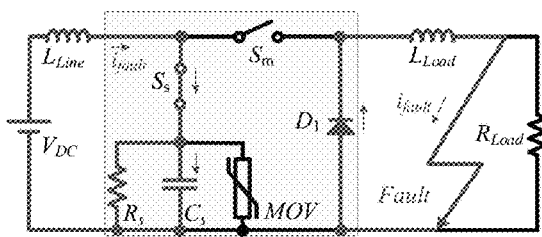
Figure 3:
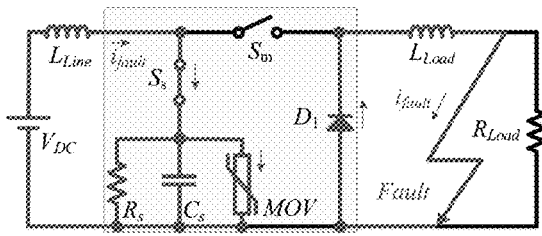
Figure 3:
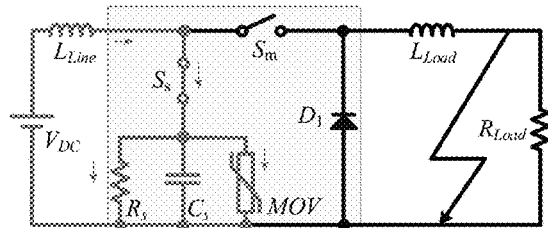
Figure 3:
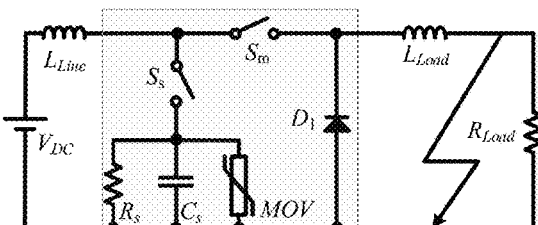
Figure 4:
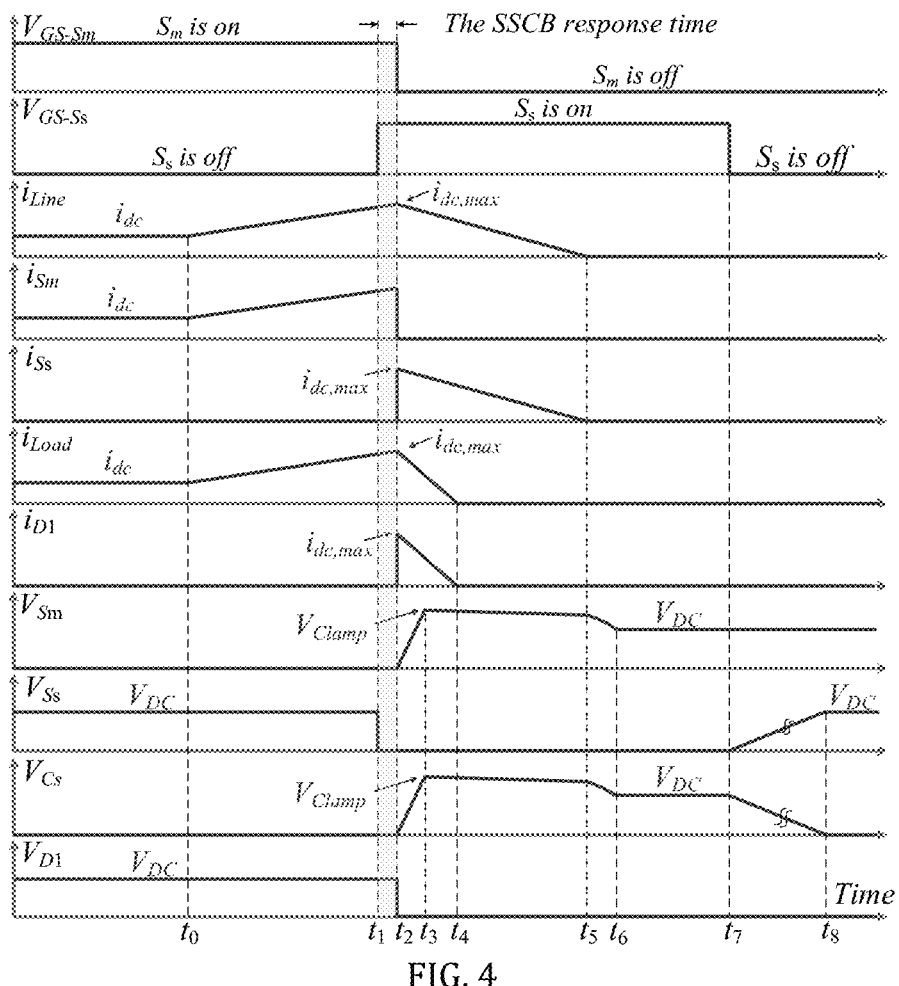

FIGS. 3 and 4 represent the operating modes and the electrical waveforms of the proposed SSCB in interrupting DC current, respectively. The working principle of the SSCB shown in FIG. 2 is explained in detailed in the following.

Mode I (before $t_0$): SSCB operates at normal condition. The main switch $S_m$ conducts the DC current, meaning $i_{Lf}=i_{Line}=i_{dc}$. $S_s$ and $D_1$ are off, so $i_{Ss}=i_{D1}=0$, and $V_{Ss}=V_{D1}=V_{DC}$.

Mode II ($t_0 \le t < t_1$): Fault occurs in the system at $t=t_0$, and the fault current rises quickly as the inertia of DC system is relatively low in comparison with the AC systems.

Mode III ($t_1 \le t < t_2$): The fault is detected at $t=t_1$. $S_s$ turns on, but the fault current cannot commutate to $S_s$. That is, the fault current cannot reduce to zero in the main switch $S_m$.

Mode IV ($t_2 \le t < t_3$): $S_m$ turns off ($i_{Sm}=0$) at $t=t_2$; the fault current commutates to $S_s$ ($i_{Lf}=i_{Ss}$), and $V_{Cs}$ begins to increase, $D_1$ turns on to conduct the line current ($i_{Line}=i_{D1}$). In this case, $V_{Sm}=V_{Cs}$ till $S_s$ is on.

Mode V ($t_3 \le t < t_6$): $V_{Cs}$ is clamped by the MOV at $t=t_3$ ($V_{Cs}=V_{Clamp}$), and the fault current commutates to the MOV ($i_{Lf}=i_{Ss}=i_{MOV}$); the line current decays to zero at $t=t_4$ ($i_{D1}=i_{Line}=0$); at $t=t_5$ the line inductor current reduces to the MOV leakage current ($i_{Ss}=i_{Lf}=i_{MOV-Leakage}$), and the voltage across the MOV starts to return to the nominal voltage; finally, $V_{Cs}=V_{Sm}=V_{DC}$ at $t=t_6$.

Mode VI ($t_6 < t < t_7$): There is a leakage current in the system due to the MOV operation ($i_{Ss}=i_{Lf}=i_{MOV-Leakage}$).

Mode VII ($t_7 \le t \le t_8$): $S_s$ turns off to eliminate the MOV's leakage current ($i_{Ss}=i_{Lf}=0$) at $t=t_7$. As the resistance value across $S_s$ at the off-state (MΩ range) is much higher than the resistance value of $R_s$ (kΩ range), $V_{DC}$ places across $S_s$ gradually. At $t=t_8$, $V_{Ss}=V_{DC}$ and $V_{CS}=0$; then, the interruption completes. It is noteworthy that the response time of the SSCB is $t_2-t_1$.

Figure 5:
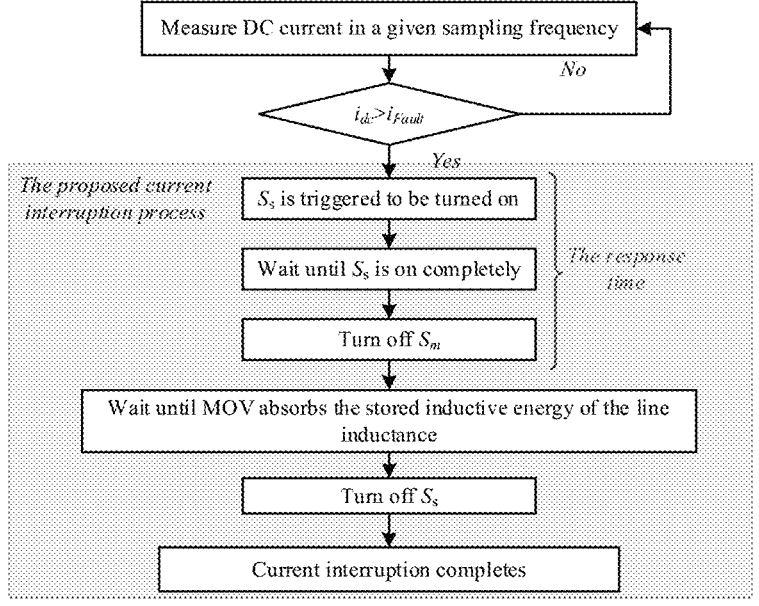
FIG. 5 shows the flowchart of the proposed current interruption process.

FIG. 5 shows the flowchart of the proposed current interruption process. The turn-off process and the logic implemented in the proposed SSCB is clear in this figure.

2.3. Design Methodology

2.3.1. $C_s$ Design Procedure

With respect to FIG. 4, $C_s$ design objective is minimizing dV/dt across the main switch $S_m$. According to section 2.2, choosing the value of $V_{Clamp}$ is important in determining the value of dV/dt. So, $C_s$ is selected optimally to optimize dV/dt. Based on FIG. 4, $t_3-t_2$ is defined as $T_p$. At $t=t_2$, following equation can be developed in the loop of $V_{DC}$-$L_{Line}$-$S_s$-$V_{Cs}$:

$$R_e i_{Cs}(t) + L_{Line} \frac{di_{Cs}(t)}{dt} + V_{Cs}(t) = V_{DC} \qquad (1)$$

where $R_e$ is the parasitic resistance of the $V_{DC}$-$L_{Line}$-$S_s$-$V_{Cs}$ loop. Considering Eq. (1), $V_{Cs}(t)$ can be described by the following differential equation:

$$\frac{d^2 V_{Cs}(t)}{dt^2} + \frac{R_e}{L_{Line}} \frac{dV_{Cs}(t)}{dt} + \frac{1}{L_{Line}C_s} V_{Cs}(t) = \frac{V_{DC}}{L_{Line}C_s} \qquad (2)$$

where the initial conditions for $V_{Cs}(t)$ are defined as follows:

$$V_{Cs}(0^+) = 0, \; i_{Cs}(0^+) = i_{dc,max} \rightarrow \frac{dV_{Cs}(0^+)}{dt} = \frac{i_{dc,max}}{C_s} \qquad (3)$$

In Eq. (3), $i_{dc,max}$ is the maximum DC current value aimed to be interrupted. Regarding Eqs. (2)-(3):

$$V_{Cs}(t) = V_{DC} + e^{-\alpha t}\left(\left(\frac{i_{dc,max}}{C_s} + \alpha V_{DC}\right)\frac{\sin(\omega_d t)}{\omega_d} - V_{DC}\cos(\omega_d t)\right) \qquad (4)$$

where $\omega_d$ and $\alpha$ are defined by Eq. (5):

$$\alpha = R_e / 2L_{Line}, \; \omega_0 = 1 / \sqrt{L_{Line}C_s}, \; \omega_d = \sqrt{|\alpha^2 - \omega_0^2|} \qquad (5)$$

For a given value of $C_s$, $T_p$ is the time instant in which $V_{Cs}(T_p)=V_{Clamp}$; that is:

$$V_{Clamp} = V_{DC} + e^{-\alpha T_p}\left(\left(\frac{i_{dc,max}}{C_s} + \alpha V_{DC}\right)\frac{\sin(\omega_d T_p)}{\omega_d} - V_{DC}\cos(\omega_d T_p)\right) \qquad (6)$$

Solving Eq. (6) leads to a complex statement. To simply find $T_p$, following approximations can be made as $T_p$ places in microseconds range:

$$e^{-\alpha T_p} \approx 1, \; \sin(\omega_d T_p) \approx \omega_d T_p, \; \cos(\omega_d T_p) \approx 1, \; \frac{i_{dc,max}}{C_s} >> \alpha V_{DC} \qquad (7)$$

In this case, Eq. (6) can be simplified and rewritten as below to find the optimized value of $C_s$ based on a desired $T_p$:

$$C_s \approx T_p i_{dc,max} / V_{Clamp} \qquad (8)$$

2.3.2. MOV Design Procedure

There are four parameters which may be of importance in selecting the MOV: 1) $V_{Clamp}$, 2) the allowable continuous DC voltage on the MOV ($V_{DC,MOV}$), 3) the surge energy rating of the MOV ($E_r$), and 4) the surge current capability ($i_{Peak}$). Since reducing $V_{Clamp}$ helps to decrease the voltage overshoots across the SSCBs and enhance the compactness, minimizing $V_{Clamp}$ may be the design objective. However, according to the working principle of the proposed SSCB explained in section 2.2, two design criteria may considered in selecting the optimal MOV which are explained below.

According to FIG. 4, the time interval of $t_3 \leq t < t_5$ may be regarded as the fault current extinguishing time ($T_{ET}=t_5-t_3$) in which the MOV conducts the current and clamps the voltage on $S_m$ and $C_s$. Eq. (9) approximates the MOV current in this interval:

$$i_{dc}(t) = i_{dc,max} - \frac{V_{MOV} - V_{DC}}{L_{Line}}(t - t_3) \qquad (9)$$

where $V_{MOV}$ is the transient voltage across the MOV which limits to $V_{Clamp}$. With respect to Eq. (9), $T_{ET}$ depends on four factors including $i_{dc,max}$, $L_{Line}$, $V_{DC}$, and $V_{Clamp}$. The surge energy on the MOV during $T_{ET}$ can be calculated as below:

$$E_{surge} = \int_{t_3}^{t_5} V_{MOV} i_{dc} dt \qquad (10)$$

This surge energy may not exceed the $E_r$ in the MOV; therefore, the selected MOV needs to satisfy Eq. (11):

$$E_{surge} < E_r \qquad (11)$$

With respect to the working principle in section 2.2 and FIG. 4, at $t=t_7$, the auxiliary switch $S_s$ turns off to remove the MOV leakage current ($i_{MOV}$) in the system. Regarding the value of $L_{Line}$, the di/dt voltage across $S_s$ in interrupting $i_{MOV}$ is:

$$V_{Ss,tr} = L_{Line}(di_{MOV} / dt) \qquad (12)$$

In Eq. (12), $C_s$ discharge current on the auxiliary resistor $R_s$ has been neglected. Regarding Eq. (12), $V_{Clamp}$ should be selected in a way that:

$$V_{Ss,tr} \leq V_{Clamp} - V_{DC} \qquad (13)$$

Figure 6:
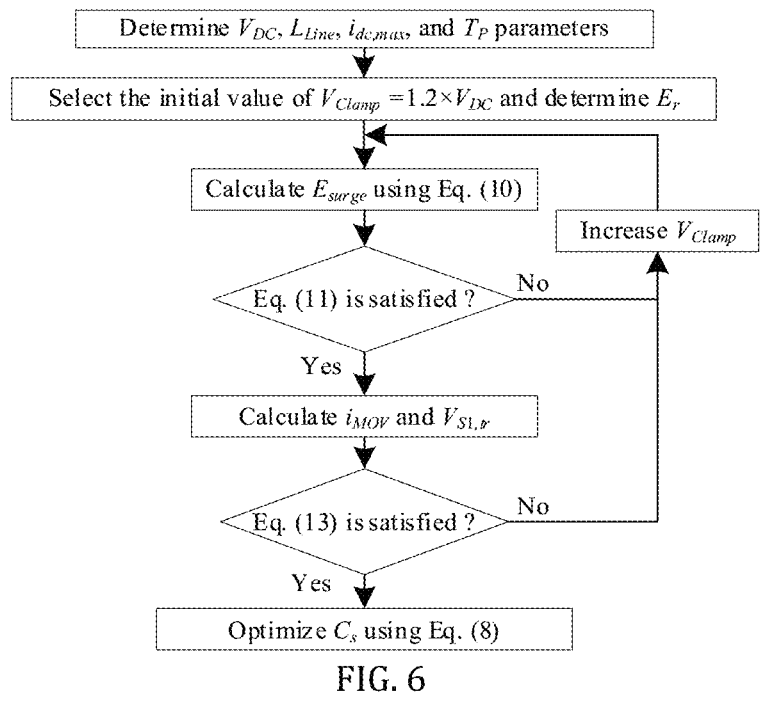
FIG. 6 summarizes the presented design procedures of $C_s$ and the MOV.

Therefore, Eqs. (11) and (13) are used to optimize the MOV in the proposed SSCB. FIG. 6 summarizes the presented design procedures of $C_s$ and the MOV.

3. MOV-RCS Snubber Based SSCBs

3.1. Circuit Topology

The proposed MOV-RCS snubber based SSCB in a typical DC system is shown in FIG. 7. The system voltage is $V_{DC}$, the line inductance is considered as $L_{Line}$, and the load is regarded as pure resistive $R_{Load}$. It should be understood that resistive-inductive loads also can be modeled the same as FIG. 7. The main switch $S_m$ provides the conduction path for continuous load currents. To achieve high efficiency, multiple switches can be connected in parallel in $S_m$. The working principle and the components design procedure of the proposed topology are presented in the following subsections.

The proposed SSCB addresses the reliability issue in SSCBs due to the MOVs degradation. The presented MOV-RCS snubber based SSCB has at least two advantages as follows:

The MOV is separated from the power line during the SSCB turn-off mode; that is, there is no voltage across the MOV after the DC current interruption. Therefore, the MOV degradation is not further a reliability issue in SSCB.

The maximum allowable operating voltage of the SSCB is extended, and the voltage overshoots across the SSCB is reduced during current interruption. This improves the power-density of the SSCBs by decreasing the voltage rating obligations on the main switch and the snubber components.

3.2. Working Principle

Figure 8:
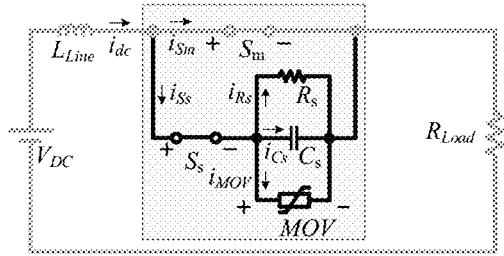
FIG. 8 shows the working principle herein and FIG. 9 displays the related electrical waveforms during a fault current interruption.
Figure 8:
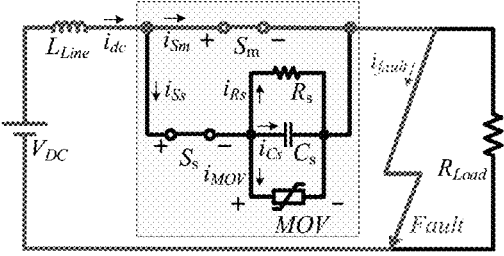
Figure 8:
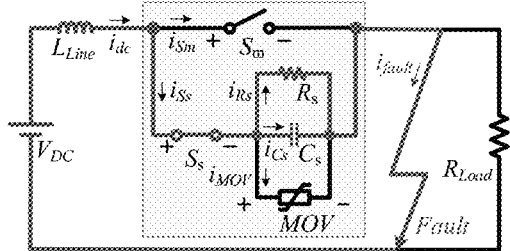
Figure 8:
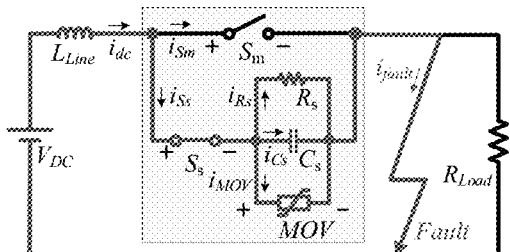
Figure 8:
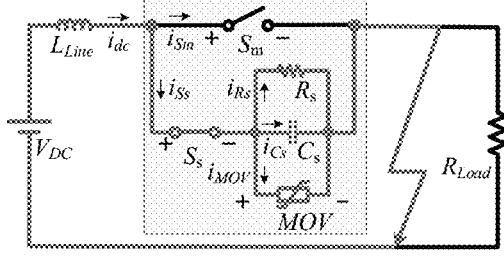
Figure 8:
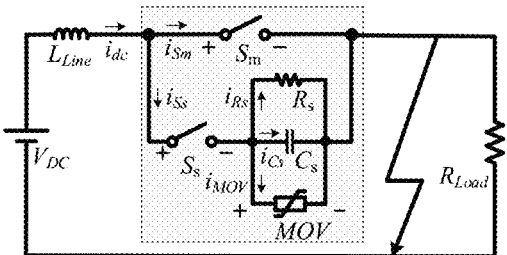
Figure 9:
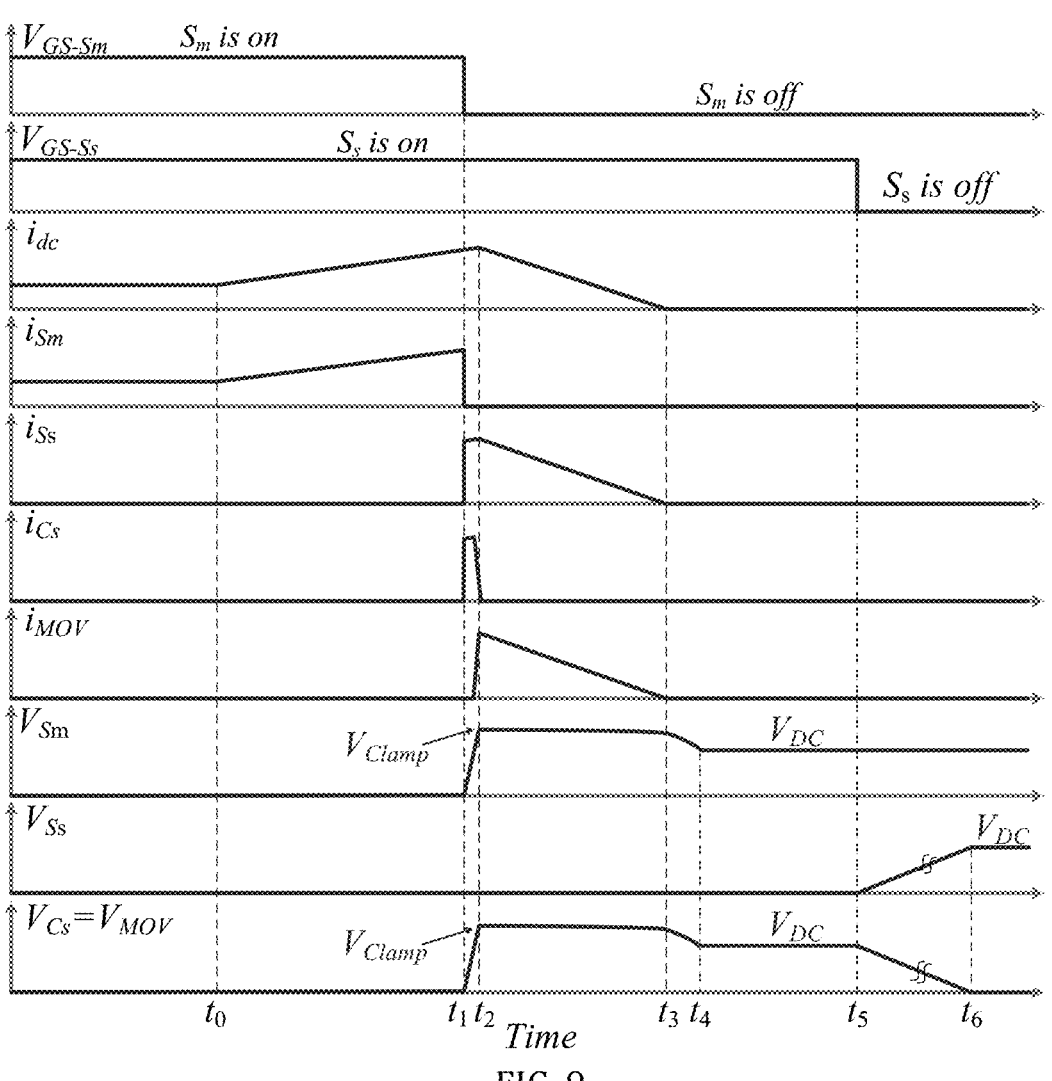

FIG. 8 shows the working principle, and FIG. 9 displays the related electrical waveforms during a fault current interruption. The operation of the proposed MOV-RCS snubber based SSCB is explained in detail as follows:

Mode I ($t < t_0$): This mode describes the normal operating condition. The main switch $S_m$ is on, and it conducts the load current ($i_{Sm} = i_{dc}$). Also, the snubber switch $S_s$ is already on. By neglecting the on-state resistance of $S_m$, the voltage across the SSCB and MOV-RCS snubber is zero ($V_{Sm} = V_{Ss} = V_{Cs} = V_{MOV} = 0$), therefore, there is no current flowing through the snubber branch ($i_{Ss} = i_{Cs} = i_{MOV} = 0$).

Mode II ($t_0 \leq t < t_1$): A fault occurs in the system at the load side as shown in FIG. 8 at $t = t_0$. The current begins to increase. The SSCB monitors the current value continuously ($i_{Sm} = i_{dc} = i_{Fault}$).

Mode III ($t_1 \leq t < t_2$): The SSCB detects the fault at $t = t_1$. The fault current interruption process begins. $S_m$ turns off to interrupt the current in the main conduction branch ($i_{Sm} = 0$). Then, the fault current commutates to the snubber circuit ($i_{Ss} = i_{Cs} = i_{dc} = i_{Fault}$), and it charges the snubber capacitor $C_s$. As $S_s$ is on ($V_{Ss} = 0$), by ignoring the parasitic inductive and resistive components in the snubber branch, the voltage on $S_m$ rises as $C_s$ charges ($V_{Sm} = V_{Cs} = V_{MOV}$). It is noteworthy that turning $S_m$ off includes a hardware delay which has not been shown in FIG. 9. The presented experimental results show this delay time interval.

Mode IV ($t_2 \leq t < t_3$): The voltage across the snubber capacitor $C_s$ exceeds the clamping voltage of the MOV ($V_{Cs} = V_{MOV} \geq V_{Clamp}$) at $t = t_2$. The impedance of the MOV reduces several orders of magnitude, and a highly conductive path is provided. Therefore, the fault current commutates to the MOV element, and the voltage is clamped to $V_{Clamp}$ considering the non-linear characteristic of the MOV. In this case, the maximum voltage peak across the $S_m$ and the snubber capacitor $C_s$ are limited to the MOV clamping voltage ($V_{Clamp}$), meaning $V_{Cs} = V_{Sm} = V_{Clamp}$. That is, $V_{Clamp}$ determines the voltage ratings of the solid-state switch $S_m$ and the snubber capacitor $C_s$; the lower the $V_{Clamp}$ is, the more compact $S_m$ and $C_s$ are. As the inductive energy of the line inductance $L_{Line}$ is absorbed by the MOV, the MOV current reduces to leakage values as shown in FIGS. 8 and 9.

It should be noted that the time interval of $t_3 - t_2$ depends on the maximum fault current value, the value of line inductance $L_{Line}$, the fault resistance, and the MOV clamping voltage $V_{Clamp}$. Higher $V_{Clamp}$ helps to shorten $t_3 - t_2$ period; therefore, $V_{Clamp}$ needs to be selected carefully.

Mode V ($t_3 \leq t < t_5$): The voltage across the MOV begins to return to the DC nominal value, reaching $V_{MOV} = V_{Cs} = V_{Sm} = V_{DC}$ at $t = t_4$. The MOV includes the leakage currents ($i_{MOV} = i_{Leakage}$) whose value is determined based on the MOV V-I characteristic and the degradation levels. In addition, the voltage across the snubber resistor $R_s$ produces a $C_s$ discharge current ($i_{Rs} = V_{DC}/R_s$). As a result, the leakage current in the system is $i_{dc} = i_{Ss} = i_{MOV} + i_{Rs}$.

Mode VI ($t_5 \leq t \leq t_6$): The snubber switch $S_s$ turns of at $t = t_5$. As the parallel resistance of $S_s$ in the off-state (M$\Omega$ range) is several orders of magnitude lower than the parallel resistance of the MOV-RC configuration (k$\Omega$ range), the voltage on the $C_s$ and the MOV starts to decrease, and the voltage on $S_s$ begins to increase simultaneously, finally reaching $V_{Cs} = V_{MOV} = V_{Rs} = 0$ and $V_{Ss} = V_{DC}$ at $t = t_6$. In his case, the leakage current in the system reduces to zero, and there is no voltage across the MOV and the snubber capacitor $C_s$ in the SSCB off-mode.

3.3. Design Methodology

The MOV-RCS snubber design procedure includes selecting the values of the $C_s$, $R_s$, MOV, and the snubber switch $S_s$. The design criteria of these components are discussed below.

C.3.1. $C_s$ Design Procedure

The $C_s$ design objective reduces the voltage peak and decelerates dV/dt across the $S_m$. The overshoot across $S_m$ is determined by $V_{Clamp}$ in the MOV, and $T_C$ is defined as $t_2 - t_1$ in FIG. 9. Therefore, $C_s$ is designed to achieve a desired $C_s$ in Mode III according to FIG. 8. Considering the series RLC circuit in this mode, following equation is valid:

$$R_f i_{dc}(t) + L_{Line} \frac{d i_{dc}(t)}{dt} + V_{Cs}(t) = V_{DC} \tag{14}$$

where $R_f$ is the fault resistance during fault current interruption; $i_{dc}$ is the current following through the breaker; and $V_{Cs}$ is the voltage across the snubber capacitor $C_s$. The following differential equation can be derived to describe $V_{Cs}$:

$$\frac{d^2 V_{Cs}(t)}{dt^2} + \frac{R_f}{L_{Line}} \frac{d V_{Cs}(t)}{dt} + \frac{1}{L_{Line} C_s} V_{Cs}(t) = \frac{V_{DC}}{L_{Line} C_s} \tag{15}$$

As the initial conditions of $C_s$ are zero, $V_{Cs}$ gets the following formula:

$$V_{Cs}(t) = V_{DC} + e^{-\alpha t} \left( \left( \frac{i_{dc,max}}{C_s} + \alpha V_{DC} \right) \frac{\sin(\omega_d t)}{\omega_d} - V_{DC} \cos(\omega_d t) \right) \tag{16}$$

where $i_{dc,max}$ is the maximum value of $i_{dc}$, and $\omega_d$ and $\alpha$ are given below:

$$\alpha = \frac{R_f}{2 L_{Line}}, \tag{17}$$

$$\omega_0 = \frac{1}{\sqrt{L_{Line} C_s}},$$

$$\omega_d = \sqrt{\left| \alpha^2 - \omega_0^2 \right|}$$

As the voltage across the $C_s$ reaches $V_{Clamp}$ in $T_C$, Eq. (16) can be rewritten as follows:

$$V_{Clamp} = V_{DC} + e^{-\alpha T_C} \left( \left( \frac{i_{dc,max}}{C_s} + \alpha V_{DC} \right) \frac{\sin(\omega_d T_C)}{\omega_d} - V_{DC} \cos(\omega_d T_C) \right) \tag{18}$$

Regarding Eqs. (17) and (18), finding $C_s$ for a given value of $T_C$ leads to a complicated formula. To simplify Eq. (18), following approximations are made considering $T_C$ in microseconds range:

$$e^{-\alpha T_C} \approx 1, \tag{19}$$

$$\sin(\omega_d T_C) \approx \omega_d T_C,$$

$$\cos(\omega_d T_C) \approx 1,$$

$$\frac{i_{dc,max}}{C_s} \gg \alpha V_{DC}$$

In this case, the optimum value of $C_s$ can be found as below:

$$C_s \geq \left(T_C i_{dc,max} / V_{Clamp}\right) \tag{20}$$

3.3.2. $R_s$ Design Procedure

As mentioned in the previous section, the snubber resistor $R_s$ may be chosen to reduce the equivalent parallel resistance of the snubber capacitor $C_s$ and the MOV compared with the snubber switch $S_s$ in the breaker's off-state. In other words, $R_s$ helps to discharge the voltage across the $C_s$ and the MOV after DC current interruption. There are at least three design criteria for $R_s$ selection:

(1) As the snubber switch $S_s$ aims to hold the DC voltage during off-state, the resistance of $R_s$ is chosen at least two orders of magnitude less than the parallel resistance of $S_s$ in the off-mode. Silicon carbide (SiC) MOSFETs show at least MΩ range parallel resistances when a negative gate-source voltage is applied on the switch; in this case, $R_s$ is chosen in a few kΩ range.

(2) After reducing the fault current to leakage values in mode V ($t_3 \leq t < t_5$) according to FIG. 8 and FIG. 9, the $R_s$ discharge current ($i_{Rs}$) is added to MOV leakage current ($i_{dc} = i_{Ss} = i_{MOV} + i_{Rs}$). $i_{Rs}$ is limited to $i_{Rs,max}$, resulting in:

$$R_s \geq V_{DC} / i_{Rs,max} \tag{21}$$

(3) $T_{dis} = t_6 - t_5$ is desirable to be minimize. $T_{dis}$ is related to the $C_s$ discharge time interval on the snubber resistor $R_s$. Considering $\tau_{Cs}$ as the $C_s$ discharge time constant:

$$\tau_{Cs} = R_s C_s \tag{22}$$

In this case, by assuming $5 \times \tau_{Cs}$ as the stabilizing time interval, the value of $R_s$ should satisfy the following equation:

$$R_s \leq T_{dis} / 5 C_s \tag{23}$$

Eqs. (21)-(23) are combined to find the optimized value of $R_s$ based on Eq. (11):

$$10 \times V_{DC} < R_s < T_{dis} / 5 C_s \tag{24}$$

3.3.3. MOV Design Procedure

The rating voltage ($V_{DC,MOV}$), the clamping voltage ($V_{Clamp}$), the rated surge energy ($E_{Rated}$), and the peak pulse current ($i_{Peak}$) may be considered in selecting the MOV in SSCBs. As the proposed MOV-RCS snubber based SSCB removes the leakage current of the MOV using the controlling switch $S_s$, the design may find the optimized value of $V_{Clamp}$.

As the $V_{Clamp}$ determines the voltage ratings of the main switch $S_m$ and the snubber capacitor $C_s$, choosing an MOV with lower clamping voltage helps to achieve a compact design and reduces the cost. Besides, lower $V_{Clamp}$ reduces the dV/dt across the main switch $S_m$ and leads to lower voltage overshoots, which enhance the reliability and lifetime. On the other hand, there are two design criteria impacting the minimum value of the $V_{Clamp}$:

Lower $V_{Clamp}$ increases the fault current extinguishing time ($t_{ET}$) as shown in FIG. 9. This time interval is considered as $t_3 - t_2$ in FIG. 9 in the proposed SSCB. As the $t_{ET}$ increases, the MOV should dissipate more energy. If this energy exceeds the MOV's $E_{Rated}$, it may be completely destroyed, or the MOV can fail as a short circuit. Therefore, $t_{ET}$ and the $E_{Rated}$ are considered to define the lower boundary of the MOV as follows:

$$V_{Clamp} > \frac{L_{Line} i_{dc,max} P_{Tr}}{E_{Rated}} + V_{DC} \tag{25}$$

where $P_{Tr}$ is the transient power on the MOV during DC current interruption.

Lower $V_{Clamp}$ leads to higher leakage currents. As the snubber switch Ss interrupts the leakage currents after DC current interruption (with respect to mode IV at $t = t_5$), high values of leakage currents lead to high di/dt across the Ss. Regarding the leakage current $i_{Ss} = i_{MOV} + i_{Rs}$ in mode V, the voltage overshoot across the $S_s$ is calculated as follows:

$$V_{Ss,Tr} = L_{Line} \frac{\Delta i_{Ss}}{\Delta t} \tag{26}$$

where $V_{Ss,Tr}$ is the di/dt voltage across the $S_s$ during the turn-off in the snubber branch. The value of $i_{Ss}$ should be limited in a way that the voltage across the main switch does not exceed $V_{Clamp}$, meaning:

$$V_{Ss,Tr} \leq V_{Clamp} - V_{DC} \tag{27}$$

3.3.4. Snubber Switch $S_s$ Design Procedure

There are at least two design criteria in selecting the snubber switch $S_s$: the voltage rating and the pulse current capability. In contrast to the main switch $S_m$ that may hold the $V_{Clamp}$, the maximum voltage on $S_s$ is $V_{DC}$ during DC current interruption as indicated in FIG. 9. Also, SiC MOSFETs usually tolerate higher values of pulse currents, which helps to obtain compactness. As transient time interval places in 10s of microseconds range, there is no obligations on cooling systems for the snubber switch $S_s$.

Figure 10:
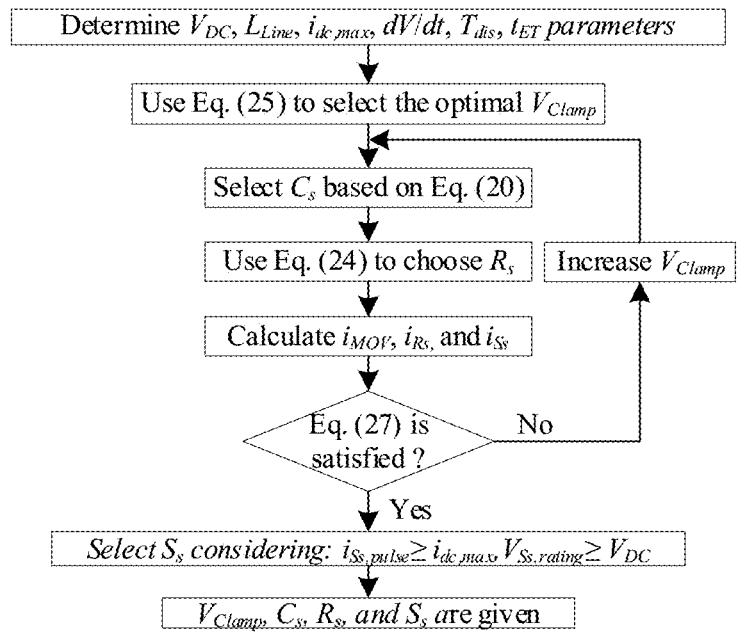
FIG. 10 summarizes the design procedure to optimize the snubber components.

FIG. 10 summarizes the design procedure to optimize the snubber components. Given the values of $V_{DC}$, $L_{Line}$, $i_{dc,max}$, desire dV/dt, $T_{dis}$ and $t_{ET}$, the optimal $V_{Clamp}$ can be found using Eq. (25). Next, Eq. (20) is used to optimize $C_s$. The value of $R_s$ is selected based on Eq. (24) to limit $i_{Ss}$. Given the values of $V_{Clamp}$, $C_s$, and $R_s$, if $V_{Ss,Tr}$ satisfies Eq. (27), $S_s$ is selected in the next step. Otherwise, $V_{Clamp}$ is increased and the process repeats.

4. Design Examples

In this section, the design examples of the proposed fault current bypass based SSCB and the MOV-RCS snubber based SSCB are presented and the experimental results are included to validate the correctness of the proposed designs.

4.1 Fault Current Bypass Based SSCB

In this section, experimental results of 375V/170 A/2.4 μs and 600V/163 A/2.4 μs are presented. FIG. 11 displays the implemented SSCB and the 3D design view. FIG. 17, Table I shows the selected semiconductor devices and the components values. The MOV voltage rating ($V_{DC,MOV}$) is 420V with the maximum clamping voltage ($V_{Clmap}$) of 830V.

4.1.1. Fault Current Bypass Based SSCB: Experiments of 375V/170 A/2.4 μs

Figure 12:
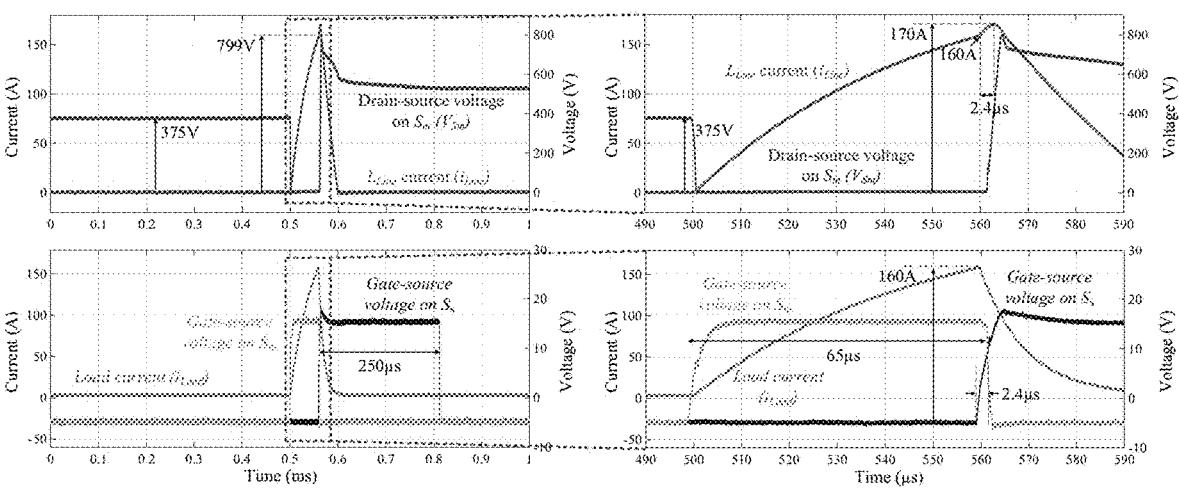
FIG. 12 shows the experimental results of 375V/170 A with the $S_m$ drain-source voltage ($V_{Sm}$) and the line inductor $L_{Line}$ current ($i_{Line}$) waveforms in the top and the gate-source voltages and load current ($i_{Load}$) waveforms in the bottom.

FIG. 12 shows the experimental results of 375V/170 A with the $S_m$ drain-source voltage ($V_{Sm}$) and the line inductor $L_{Line}$ current ($i_{Line}$) waveforms in the top and the gate-source voltages and load current ($i_{Load}$) waveforms in the bottom. To compensate the leakage inductance in the main switch $S_m$, an RC snubber (R=1Ω and C=100 nF) has been connected to the drain-source terminals of $S_m$.

As illustrated in FIG. 12, the main switch $S_m$ turns on for 65 μs, and when the DC current reaches about 160 A, current interruption begins by turning $S_s$ on. After a safe delay (≈2 μs), $S_m$ is triggered to be turned off. $S_m$ turns off completely after 400 ns, and the DC current is interrupted in the main switch after 2.4 μs. Next, the current commutates to $S_s$ and charges $C_s$. The $V_{Cs}(=V_{Sm})$ rises to 799V in 2.7 μs which is close to the expected value of Eq. (8) (2.5 μs considering $C_s$=500 nF, $V_{Clamp}$=799V, and $i_{dc,max}$=160 A). The peak of the current in the $S_s$ reaches 170 A, and it reduces to leakage values in 37 μs.

$S_s$ turns off after 250 μs. This interval is determined considering the fault current extinguishing time interval ($T_{ET}$) which depends on $i_{dc,max}$, $L_{Line}$, $V_{DC}$, and $V_{Clamp}$ factors. As $S_s$ turns off, it holds the $V_{DC}$ in the auxiliary branch. Also, the current in the load side begins to decrease after $S_m$ turn-off, reducing to zero in 55 μs.

According to the gate-source voltage waveforms in FIG. 12, it is concluded that no voltage oscillations appear on the gate terminals during the DC current breaking, which facilitates the fully utilization of the electrical ratings of SiC MOSFETs in practice. The dV/dt across $S_m$ is controlled using the correct selectin of $C_s$. Also, the stored inductive energy of $L_{Line}$ is prevented to flow through the faulty section after $S_m$ turn-off.

4.1.2. Fault Current Bypass Based SSCB: Experiments of 600V/163 A/2.4 μs

The designed SSCB of FIG. 11 is tested in a 600V DC system with the same components. The resulted waveforms are represented in FIG. 13. $S_m$ turns on for 25 μs, and when the value of the DC current reaches around 141.5 A, $S_s$ turns on. Then, $S_m$ turns off completely after 2.4 μs, showing the same response time.

The current in $S_s$ gets the peak value of 163.3 A, and it reduces to 2.3 A (=$i_{Ss}$) in 177 μs where the current share of resistor $R_s$ (=6.8 kΩ) is 88 mA, and the remaining 2.212 A flows through the MOV as the leakage current. Also, the current at the load side decays to zero in 55 μs after $S_m$ turn-off. The maximum voltage across $C_s$ ($V_{Cs}=V_{Sm}$) reaches 799V ($V_{Clamp}$) in 3 μs ($T_p$). As indicated in FIG. 13, $S_s$ turns off after 250 μs, and the leakage current in the auxiliary branch (=$i_{Ss}$) reduces to zero.

The experimental results in 600V DC system show that MOVs with the DC ratings below the nominal voltage of the DC system can be used to achieve lower clamping voltage.

In this case, the voltage overshoot across the main switch is decreased, and the dV/dt is reduced. Besides, the designed SSCB has the capability to be adjusted for different voltage and current ratings, which is highly beneficial in industrial applications.

4.2 MOV-RCS Snubber Based SSCB

To validate the proposed MOV-RCS snubber based SSCB, it is tested at two different voltages. First, the SSCB interrupts 160 A current in a 375V DC system where $V_{DC,MOV}>V_{DC}$. Second, the SSCB is tested in a 550V DC system to interrupt 158 A with the same components; while, $V_{DC,MOV}<V_{DC}$. FIG. 14 (a) shows the implemented hardware set up with respect to FIG. 7. Also, FIG. 14 (b) indicates the 3D design view of the SSCB. The DC system and the SSCB parameters are listed in FIG. 18, Table II. The current interruption process is controlled by a TMS320F28335 processor in a time sequence manner.

4.2.1. MOV-RCS Snubber Based SSCB: Experiments of 375V/160 A/1.6 μs SSCB

In this section, the SSCB is tested in a 375V DC system to interrupt 160 A current, where it achieves 1.6 μs response time. FIG. 15 indicates the experimental results. At the left side, the drain-source voltage on the main switch ($V_{Sm}$), the line current ($i_{Line}$), the voltage on the snubber capacitor $C_s$ ($V_{Cs}$), the drain-source voltage on the snubber switch ($V_{Ss}$), the gate-source voltages on the main switch $S_m$ ($V_{GS,Sm}$) and the snubber switch $S_s$ ($V_{GS,Ss}$) are represented, respectively. At the right side, the details are also provided to show the transient.

FIG. 15 shows the working process. As $S_m$ turns on, the DC current flows through the line inductor ($L_{Line}$) and the load ($R_{Load}$). After 5 μs, the snubber switch $S_s$ turns on. Since the voltage across $S_m$ is zero, there is no current in the snubber branch ($i_{Ss}$=0). During on-state, the DC current reaches 160 A and the current interruption process begins.

To interrupt the current, $S_m$ turns off at t=320 μs. The current commutates to the snubber branch and charges $C_s$ to 777V ($V_{Clamp}$) in 1.2 μs interval (=$T_C$), which is close to the estimated 1.03 μs according to Eq. (20) ($V_{Clamp,max}$=830V, $C_s$=200 nF, and $i_{dc,max}$=160 A). The voltage across $C_s$ is clamped by the MOV. As $V_{Cs}$ exceeds $V_{DC}$, the line current ($i_{Line}$) starts to decrease. $i_{Line}$ reduces to the leakage value in 34 μs.

The leakage current in the snubber switch ($i_{Ss}$) includes the MOV leakage current ($i_{MOV}$) and the discharge current through the snubber resistor $R_s$ ($i_{Rs}$). As the DC voltage ($V_{DC}$=375V) is lower than the MOV rating ($V_{DC,MOV}$=420V), $i_{MOV}$ should be around 10s of μA for a non-degraded MOV. Also, the discharge current through $R_s$ is limited to 55 mA ($i_{Rs}$). After 250 μs of $S_m$ turn-off (at t=320+250 μs), $S_s$ turns off to completely eliminate the leakage current in the snubber branch.

After turning $S_s$ off, $V_{Cs}(=V_{MOV})$ starts to discharge through $R_s$, and the voltage across $S_s$ increases and finally reaches $V_{DC}$. In this case, the voltage on $C_s$ and MOV is reduced to zero, and $S_s$ holds the DC bus voltage.

In FIG. 15, the response time has two intervals: 1) $S_m$ turn-off delay to reduce the current in the main branch to zero, which is 0.4 μs, 2) $C_s$ charging time to increase $V_{Cs}$ until $V_{Clamp}$, which is 1.2 μs. Then, the response time is 1.6 μs (0.4 μs+1.2 μs). For other current values ($i_{dc}$), the response time can be found as below:

$$T_{op} \approx 4 \times 10^{-7} + (C_s V_{Clamp})/i_{dc} \tag{28}$$

where $T_{op}$ is defined as the response time of the SSCB.

4.2.2. MOV-RCS Snubber Based SSCB: Experiments of 550V/158 A/1.6 μs SSCB

The SSCB is also tested in a 550V ($V_{DC}$) system to interrupt 158 A with the same components in Table II. In this case, the DC bus voltage is higher than the MOV rating voltage, meaning $V_{DC,MOV} < V_{DC}$. The response time of the breaker is still 1.6 μs. The experimental results are shown in FIG. 16.

As indicated in FIG. 16, the main switch $S_m$ turns on at t≈175 μs, and the current begins to increase. Also, the snubber switch $S_s$ turns on after 5 μs. As $S_m$ is on, there is no current in the snubber branch ($i_{Ss} = i_{Cs} \approx 0$). After 25 μs, the current reaches 158 A, and $S_m$ is triggered to interrupt the current.

By turning $S_m$ off (with a delay of 0.4 μs), the current commutates to the snubber branch and charges $C_s$. $V_{Cs}$ reaches 777V ($V_{Clamp}$) in 1.2 μs ($T_C$). As the MOV clamps the voltage, it absorbs the stored inductive energy in $L_{Line}$ and forces the current to the leakage value in 100 μs.

The leakage current flowing through the snubber switch $S_s$ is measured as 1.6 A, where the share of the snubber resistor $R_s$ is 80 mA ($= i_{Rs} = V_{DC}/R_s$). The rest of the current ($=1.52$ A) is the leakage current flowing through the MOV. As shown in FIG. 16, this leakage current is obvious. It needs to be mentioned that this leakage current increases as the MOV degrades.

After 250 μs of $S_m$ turn-off, the snubber switch $S_s$ also turns off at t=450 μs to eliminate the leakage current. Regarding the line current ($i_{Line}$) in FIG. 16, the time instance in which $S_s$ breaks the leakage current is clear.

Due to the stored inductive energy in $L_{Line}$, interrupting 1.6 A leakage current leads to 180V voltage peak across $S_s$ which is lower than the expected 252V ($V_{Ss,Tr}$) according to Eq. (26) (for $L_{Line}=63μ$, $i_{Ss}=1.6$ A, and $S_s$ turn-off delay of 0.4 μs). The source of difference can be found within the drain-source capacitance of the $S_s$ which helps to reduce the voltage peak. As shown in FIG. 16, after turning $S_s$ off, the voltage on the MOV ($V_{MOV} = V_{Cs}$) begins to decrease, and the voltage across $S_s$ rises at the same time. It will finally reach the DC bus voltage $V_{DC}$, where the interruption process completes.

Conclusion

The disclosure is a new solid state circuit breaker and a new active clamping snubber are presented. First circuit is a new fault current bypass based solid state breaker for low voltage direct current systems. It can bypass fault currents using a new developed auxiliary branch, reduce the overshoot voltage across the breaker, remove the leakage current of the energy absorbing elements, and provide fast speed operation. Second circuit is a new active clamping circuits which can be used for a variety of direct current breakers. The device(s) address the MOV degradation issue, enhancing the lifetime and reliability of the breakers, reducing the voltage overshoot across the breakers, and avoiding leakage current of the energy absorbing elements. Proposed circuit breakers obtain current scalability and extend the allowable DC bus voltage on the breakers. Mathematical calculations, simulations, and experiments have been conducted to verify the effectiveness and practicality of the proposed topologies.

Two designs are presented as named as "fault current bypass based solid state breaker" and "active clamping snubbers." The advantages of the presented topologies over current methods are summarized as follows:

Fault current bypass based solid state breaker advantages: 1) it can bypass fault currents using a new developed auxiliary branch, 2) it reduces the overshoot voltage across the breaker, 3) it removes the leakage current of the energy absorbing elements, 4) it extends the allowable DC bus voltage on the breakers, and 5) it provides a fast speed operation.

Active clamping snubber advantages: 1) addressing the MOV degradation issue, 2) enhancing the lifetime and reliability of the breakers, 3) reducing the voltage overshoot across the breakers, 4) it extends the allowable DC bus voltage on the breakers, and 5) avoiding leakage current of the energy absorbing elements.

Embodiments

Embodiment 1: A fault current bypass based solid state circuit breaker comprising: a voltage source ($V_{DC}$) connected in series a line inductor ($i_{Line}$) through which a DC current ($i_{DC}$) flows; wherein the line inductor ($i_{Line}$) is connected in parallel to a main switch ($S_m$) and a metal oxide varistor resistive capacitive switch (MOV-RCS) snubber, wherein the DC current ($i_{DC}$) splits to provide main switch current ($i_{Sm}$) to the main switch ($S_m$) and snubber current (iS1) to the snubber; wherein the main switch ($S_m$) and a diode ($D_1$) provide load current ($i_{Load}$) across a load inductor ($L_{Load}$); wherein the load inductor current ($i_{Load}$) from the load inductor ($L_{Load}$) then passes through a load resistor ($R_{Load}$); wherein the load resistor ($R_{Load}$) is connected in series to an anode side of the diode ($D_1$) and an output of the snubber (MOV-RCS); and wherein the output of the snubber is connected to the voltage source ($V_{DC}$).

Embodiment 2: The fault current bypass based solid state circuit breaker of embodiment 1, wherein the snubber comprises: a snubber switch ($S_s$) in series with the following components that are in parallel with one another: a snubber Resistor ($R_s$), a snubber capacitor ($C_s$) and a metal oxide varistor (MOV).

Embodiment 3: The fault current bypass based solid state circuit breaker of embodiment 2, wherein a nominal voltage flows through the solid state circuit breaker at a voltage near to a clamping voltage of the metal oxide varistor.

Embodiment 4: The fault current bypass based solid state circuit breaker of embodiment 2, wherein the rate of change of voltage (dV/dt) across the main switch ($S_m$) is reduced by the snubber capacitor ($C_s$).

Embodiment 5: The fault current bypass based solid state circuit breaker of embodiment 2, wherein the snubber switch (Ss) turns off at almost zero current.

Embodiment 6: The fault current bypass based solid state circuit breaker of embodiment 5, wherein no oscillations appear on the snubber switch (Ss) during current interruption.

Embodiment 7: The fault current bypass based solid state circuit breaker of embodiment 2, wherein stored inductive energy of the line inductor ($i_{Line}$) is prevented to flow through a faulty section of a circuit.

Embodiment 8: A solid state circuit breaker comprising: a voltage source ($V_{DC}$) connected in series a line inductor ($i_{Line}$) through which a DC current ($i_{DC}$) flows; wherein the line inductor ($i_{Line}$) is connected in parallel to a main switch ($S_m$) and a metal oxide varistor resistive capacitive switch (MOV-RCS) snubber, wherein the DC current ($i_{DC}$) splits to provide main switch current ($i_{Sm}$) to the main switch ($S_m$) and snubber current ($i_{Ss}$) to the snubber; wherein the main switch ($S_m$) and the snubber provide current to a load resistor ($R_{Load}$); and wherein the load resistor ($R_{Load}$) is connected to the voltage source ($V_{DC}$).

Embodiment 9: The fault current bypass based solid state circuit breaker of embodiment 8, wherein the snubber comprises: a snubber switch ($S_s$) in series with the following components that are in parallel with one another: a snubber Resistor ($R_s$), a snubber capacitor ($C_s$) and a metal oxide varistor (MOV).

While the invention has been described with reference to the embodiments herein, a person of ordinary skill in the art would understand that various changes or modifications may be made thereto without departing from the scope of the claims.

The invention claimed is:

1. A fault current bypass based solid state circuit breaker comprising:

a voltage source ($V_{DC}$) connected in series a line inductor ($i_{Line}$) through which a DC current ($i_{DC}$) flows;

wherein the line inductor ($i_{Line}$) is connected in parallel to a main switch ($S_m$) and a metal oxide varistor resistive capacitive switch (MOV-RCS) snubber, wherein the DC current ($i_{DC}$) splits to provide main switch current ($i_{Sm}$) to the main switch ($S_m$) and snubber current (iS1) to the snubber;

wherein the main switch ($S_m$) and a diode ($D_1$) provide load current ($i_{Load}$) across a load inductor ($L_{Load}$);

wherein the load inductor current ($i_{Load}$) from the load inductor ($L_{Load}$) then passes through a load resistor ($R_{Load}$);

wherein the load resistor ($R_{Load}$) is connected in series to an anode side of the diode ($D_1$) and an output of the snubber (MOV-RCS); and wherein the output of the snubber is connected to the voltage source ($V_{DC}$).

2. The fault current bypass based solid state circuit breaker of claim 1, wherein the snubber comprises:

a snubber switch ($S_s$) in series with the following components that are in parallel with one another: a snubber Resistor ($R_s$), a snubber capacitor ($C_s$) and a metal oxide varistor (MOV).

3. The fault current bypass based solid state circuit breaker of claim 2, wherein a nominal voltage flows through the solid state circuit breaker at a voltage near to a clamping voltage of the metal oxide varistor.

4. The fault current bypass based solid state circuit breaker of claim 2, wherein the rate of change of voltage (dV/dt) across the main switch ($S_m$) is reduced by the snubber capacitor ($C_s$).

5. The fault current bypass based solid state circuit breaker of claim 2, wherein the snubber switch (Ss) turns off at almost zero current.

6. The fault current bypass based solid state circuit breaker of claim 5, wherein no oscillations appear on the snubber switch (Ss) during current interruption.

7. The fault current bypass based solid state circuit breaker of claim 2, wherein stored inductive energy of the line inductor ($i_{Line}$) is prevented to flow through a faulty section of a circuit.

\* \* \* \* \*